(12) United States Patent
Zhang et al.

(10) Patent No.: US 12,057,420 B2
(45) Date of Patent: Aug. 6, 2024

(54) CHIP, CIRCUIT BOARD AND ELECTRONIC DEVICE COMPRISING POLYGONAL PADS

(71) Applicant: Beijing Xiaomi Mobile Software Co., Ltd., Beijing (CN)

(72) Inventors: Jinfu Zhang, Beijing (CN); Yunjun Hua, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 17/208,454

(22) Filed: Mar. 22, 2021

(65) Prior Publication Data

US 2022/0013484 A1    Jan. 13, 2022

(30) Foreign Application Priority Data

Jul. 8, 2020  (CN) .......................... 202010653933.6

(51) Int. Cl.
*H01L 23/00* (2006.01)
*H01L 23/498* (2006.01)

(52) U.S. Cl.
CPC ........ *H01L 24/06* (2013.01); *H01L 23/49816* (2013.01); *H01L 24/05* (2013.01);
(Continued)

(58) Field of Classification Search
CPC ................. H01L 24/06; H01L 24/05; H01L 2224/05012; H01L 2224/05552; H01L 2224/05554; H01L 2224/0603; H01L 2224/06051; H01L 2224/06131; H01L 2224/06179; H01L 2224/13111; H01L 2224/16227; H01L 23/49816; H01L 23/49838; H01L 24/16; H01L 2924/00012; H01L 2924/3512; H01L 2924/381; H01L 2224/0401; H05K 1/111; H05K 2201/09381; H05K 2201/094; H05K 2201/09409; H05K 2201/09418; H05K 2201/10734; H05K 2203/041; H05K 3/3436
(Continued)

(56) References Cited

U.S. PATENT DOCUMENTS

| 6,429,390 B1 | 8/2002 | Cummings et al. |
| 2001/0001508 A1 | 5/2001 | Garrity et al. |

(Continued)

FOREIGN PATENT DOCUMENTS

| EP | 3 890 004 A1 | 10/2021 |
| JP | H05166810 A * | 7/1993 |

(Continued)

OTHER PUBLICATIONS

Extended European Search Report in European Application No. 21164238.4, mailed on Sep. 6, 2021.
(Continued)

*Primary Examiner* — Nduka E Ojeh
*Assistant Examiner* — Laura M Dykes
(74) *Attorney, Agent, or Firm* — Finnegan, Henderson, Farabow, Garrett & Dunner, L.L.P

(57) ABSTRACT

The present disclosure relates to a chip, a circuit board and an electronic device. The chip includes a chip substrate and a plurality of pads arrayed on the chip substrate. At least one of the plurality of pads on the chip is a polygonal pad.

13 Claims, 7 Drawing Sheets

(52) U.S. Cl.
CPC .... *H01L 24/16* (2013.01); *H01L 2224/05012* (2013.01); *H01L 2224/05552* (2013.01); *H01L 2224/05554* (2013.01); *H01L 2224/0603* (2013.01); *H01L 2224/06051* (2013.01); *H01L 2224/06131* (2013.01); *H01L 2224/06179* (2013.01); *H01L 2224/13111* (2013.01); *H01L 2924/3512* (2013.01)

(58) Field of Classification Search
USPC ........................................................ 257/734
See application file for complete search history.

(56) References Cited

U.S. PATENT DOCUMENTS

| | | | |
|---|---|---|---|
| 2003/0054589 A1 | 3/2003 | Matsuda et al. | |
| 2009/0114436 A1* | 5/2009 | Chen | H05K 3/3452 174/263 |
| 2010/0180249 A1* | 7/2010 | Rumsey | H01L 24/13 716/55 |
| 2010/0295186 A1* | 11/2010 | Kawabata | H01L 25/105 257/773 |
| 2011/0108981 A1 | 5/2011 | Rahim et al. | |
| 2011/0309515 A1 | 12/2011 | Yokoyama | |
| 2012/0199969 A1 | 8/2012 | Yokoyama | |
| 2013/0049206 A1 | 2/2013 | Ryan | |
| 2013/0062741 A1 | 3/2013 | Wu et al. | |
| 2017/0062322 A1 | 3/2017 | Sakata et al. | |
| 2017/0246699 A1* | 8/2017 | Song | H01L 23/4985 |
| 2019/0123006 A1* | 4/2019 | Chen | H01L 24/06 |
| 2019/0280038 A1 | 9/2019 | Keel et al. | |

FOREIGN PATENT DOCUMENTS

| | | |
|---|---|---|
| JP | H 10335796 A | 12/1998 |
| JP | 2000031631 A | 1/2000 |
| JP | 2000269271 A | 9/2000 |
| JP | 2001127202 A | 5/2001 |
| JP | 2005026312 A | 1/2005 |
| JP | 3758289 B2 | 3/2006 |
| JP | 2006210851 A | 8/2006 |
| JP | 2009054969 A | 3/2009 |
| JP | 2009218233 A | 9/2009 |
| JP | 2010287758 A | 12/2010 |
| JP | 2017118149 A | 6/2017 |
| JP | 2019071345 A | 5/2019 |
| KR | 20170047487 A | 5/2017 |

OTHER PUBLICATIONS

Extended European Search Report in European Application No. 21164242.6, mailed on Oct. 26, 2021.
Notice of Reasons for Refusal of Japanese Application No. 2021-044590, issued on Apr. 8, 2022.
Notice of Reasons for Refusal of Japanese Application No. 2021-044597, issued on Mar. 18, 2022.
Decision to Grant a Patent of Japanese Patent Application No. 2021-044590, issued on Oct. 27, 2022.
Request for the Submission of an Opinion of Korean Patent Application No. 10-2021-0035300, issued on Jan. 9, 2023.
Request for the Submission of an Opinion of Korean Patent Application No. 10-2021-0035301, issued on Jul. 18, 2023.

* cited by examiner

CHIP, CIRCUIT BOARD AND ELECTRONIC DEVICE COMPRISING POLYGONAL PADS

CROSS REFERENCE TO RELATED APPLICATION

The present application is based upon and claims the priority of Chinese Patent Application No. 202010653933.6, filed on Jul. 8, 2020, the entire content of which is incorporated herein by reference.

TECHNICAL FIELD

The present disclosure relates to the field of electronic technology, in particular to chips, circuit boards and electronic devices.

BACKGROUND

In related technologies, an electronic device, such as a mobile phone, usually contains a chip for realizing various functions, and electronic components and control circuits on chips are packaged through pads and tin balls soldered on the pads. However, with gradual enrichment of chip functions and increasing complexity of chip circuits per unit size for packaging, overall size of the chip increases, which has an adverse effect on the overall lightness and thinness of the chip and electronic device.

SUMMARY

According to a first aspect of the present disclosure, a chip includes: a chip substrate and a plurality of pads provided on the chip substrate. The plurality of pads are arrayed on the chip substrate; and at least one of the plurality of pads is a polygonal pad.

According to a second aspect of the present disclosure, a circuit board includes: a circuit board substrate; and a plurality of pads provided on the circuit board substrate. The plurality of pads are arrayed on the circuit board substrate; and at least one of the plurality of pads is a polygonal pad.

According to a third aspect of the present disclosure, an electronic device includes: the above chip and the above circuit board.

It should be understood that the above general description and the following detailed description are only exemplary and explanatory, and do not intend to limit the present disclosure.

BRIEF DESCRIPTION OF THE DRAWINGS

The drawings herein are incorporated into the specification and constitute a part of the specification, show embodiments consistent with the present disclosure, and together with the specification are used to explain the principle of the present disclosure.

DETAILED DESCRIPTION

Exemplary embodiments will be described in detail below, and examples thereof are shown in the accompanying drawings. In the following description of the drawings, same numbers in different drawings represent same or similar elements, unless otherwise indicated. The embodiments described in the following exemplary embodiments do not represent all of embodiments consistent with the present disclosure. Rather, they are only examples of devices and methods consistent with some aspects of the present disclosure as recited in the appended claims.

In related technologies, electronic devices, such as mobile phones, usually contain chips for realizing various functions, and electronic components and control circuits on the chips are packaged through pads and tin balls soldered on the pads. However, a distance between centers of adjacent pads on a chip in the related art is greater than or equal to 0.35 mm, such as 0.8 mm, 0.5 mm, 0.4 mm, and 0.35 mm.

With gradual enrichment of chip functions and increasing complexity of chip circuits per unit size for packaging, overall size of the chip increases, which has an adverse effect on the overall lightness and thinness of the chip and electronic device. In addition, the internal wafer packaging of the chip has been refined to 7 nm in batches, and internal wiring of the circuit board assembled with the chip can be packaged by the mSAP process, and thus the pad packaging process for connecting a chip with a PCB becomes a bottleneck in the entire industry chain.

Figure 1:
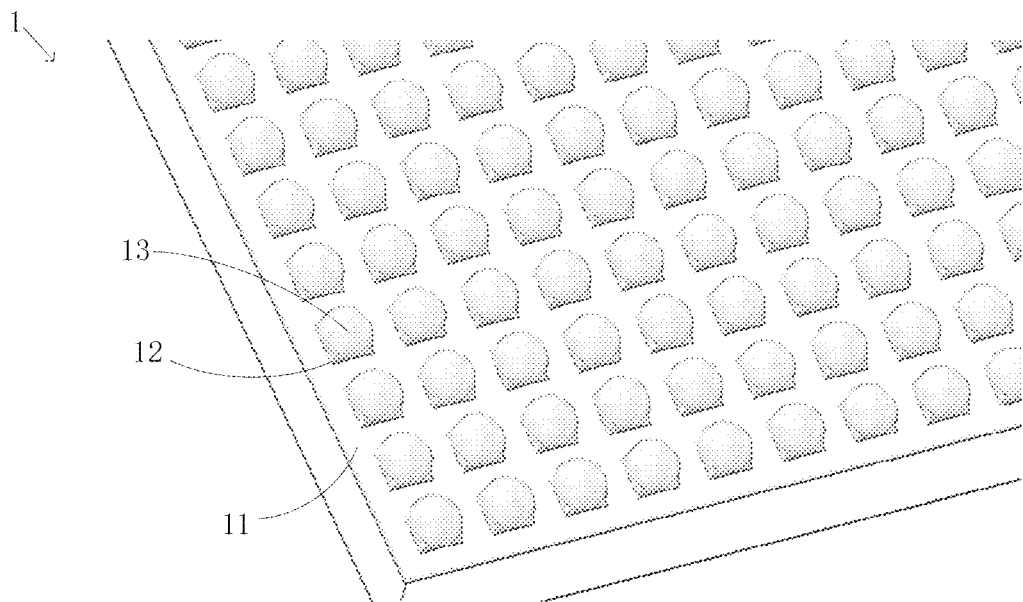
FIG. 1 is a partial three-dimensional schematic diagram of a chip after soldering tin balls in an exemplary embodiment of the present disclosure.
Figure 2:
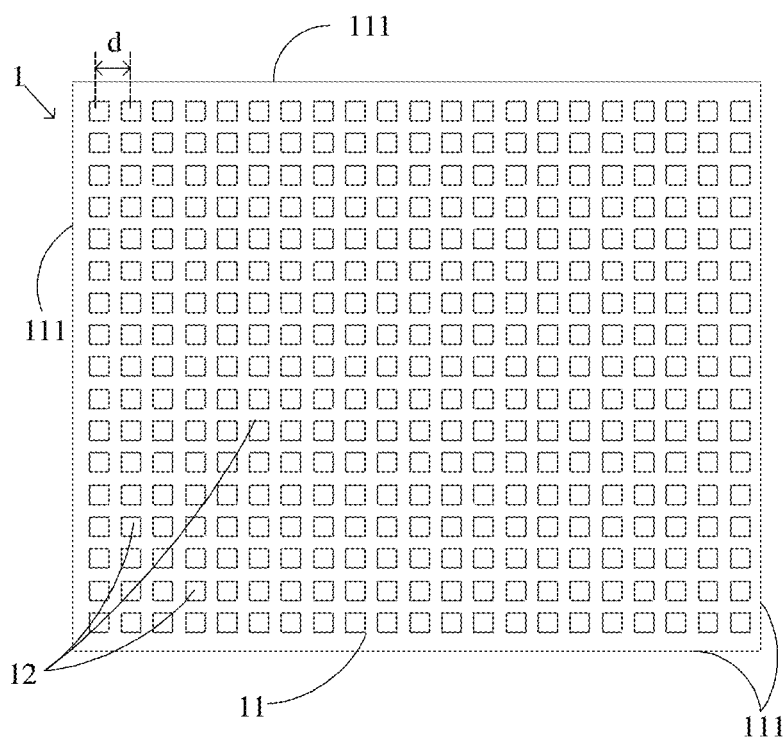
FIG. 2 is a schematic top view of a chip before soldering tin balls in an exemplary embodiment of the present disclosure.

FIG. 1 is a partial three-dimensional schematic diagram of a chip 1 after soldering a tin ball in an exemplary embodiment of the present disclosure; and FIG. 2 is a schematic top view of the chip 1 before soldering tin balls in an exemplary embodiment of the present disclosure. As shown in FIGS. 1 and 2, the chip 1 includes a chip substrate 11 and a plurality of pads 12 provided on the chip substrate 11. The plurality of pads 12 are arrayed on the chip substrate 11, and at least one of the plurality of pads 12 may be a polygonal pad.

In some embodiments, the pad 12 on the chip 1 is provided as a polygonal pad, and the change in the shape of the pad 12 can shorten a distance between adjacent pads 12, and thus the chip 1 can have a reduced size. In addition, an array of the polygonal pads which has a straight side may improve ability of the pad 12 to resist stress, increase structural strength of the pad 12 itself. A tin ball 13 can be soldered on each pad. The above structure can further increase bonding strength between the pad 12 and the tin ball 13, prevent the pad 12 and the tin ball 13 from being disconnected from each other due to impacts, drops and the like during testing and using, and improve the chip 1 to be slimmer.

In some embodiments, based on the above configuration, a distance d between centers of adjacent pads 12 can be 0.3 mm. The pad 12 on the chip 1 is a polygonal pad. By changing the shape of the pad 12, the distance d between adjacent pads 12 is shortened to 0.3 mm, thereby reducing the size of the chip 1. When the pad 12 is a polygonal pad, the side of the polygonal pad is a straight side, and the straight side has a good stress buffer effect. With sufficient stress resistance strength of the pad 12 being ensured and no short circuit problem such as stringing tin between adjacent pads 12, the polygonal pad can have a reduced area compared to a circular pad, while the distance between the sides of adjacent pads 12 remains unchanged, for example, the distance between the sides of adjacent pads 12 is 0.12 mm, and the overall size of the chip 1 using polygonal pads can be reduced.

In some embodiments, the plurality of pads 12 may include at least one polygonal pad and at least one pad with another shape. In some embodiments, the plurality of pads 12 are all polygonal pads. The pad 12 on the chip 1 bears normal stress due to deformation when the chip 1 is, for example, impacted, and if the pad 12 is designed to have the polygonal structure, and a portion of the pad 12 that bears the external force is a side of the polygonal pad (not an arc vertex as usual), and a ratio of a part of sides of the polygonal pad for bearing the external force to the total side length can be increased to 60% from 33%. According to the Griffith fracture criterion: a necessary condition for generating a brittle fracture under a static condition is that energy released by a fracture zone is equal to energy required to form a crack area. That is, if the energy generated by the external stress is to produce a crack, the energy due to the external stress must be greater than the energy required to form the crack area. When the crack area is approximated as a rectangle for calculation, it is found that when the crack depth is the same, the longer the crack, the larger the crack area; the wider the width of the crack surface, the shorter the crack length, and the smaller the crack area when the crack depth is the same. That is, the increase in the width of the surface where cracks may occur can effectively decompose the stress acting on the surface. Under the same applied deformation force, the wider the width of the solder joint on the outer surface of the chip 1, the shorter the crack depth will be, which makes the pad 12 of the chip 1 with a wider outside has a stronger ability to withstand the normal stress on the outside of the chip 1, and thus the straight sides of the polygonal pad array can facilitate to strengthen the ability of the pad 12 to resist stress.

In the above embodiment, the polygonal pad may include at least one of a quadrangular pad, a pentagonal pad, a hexagonal pad, or an octagonal pad. Each vertex of the polygonal pad can be provided with a circular arc or linear chamfer to form a polygonal pad structure with the chamfer, to avoid damage such as cracking of the polygonal pad due to stress concentration at a fixed angle position. In some embodiments, at least part of the pads 12 may be arrayed along a direction parallel to a side 111 of the chip substrate 11, and/or at least part of the pads 12 may be arrayed along a direction at a preset angle with respect to the side 111 of the chip substrate 11, and the preset angle can be greater than or equal to 30° and less than or equal to 60°. In an embodiment, the preset angle may be 45°, to achieve a better buffer effect for stress in various directions based on the direction along which pads 12 are arrayed.

In some embodiments, the polygonal pad may be a quadrilateral pad. For example, as shown in FIG. 2, the polygonal pad is a square pad. The sides of the square pad are parallel or perpendicular to the side 111 of the chip substrate 11, and the square pads may be arrayed along a direction parallel to the side 111 of the chip substrate 11. The square pad in the array has a simple structure, and an enhanced ability to withstand the normal stress on the outside of the chip 1 due to the square pad has four sides parallel or perpendicular to the side 111 of the chip substrate.

Figure 3:
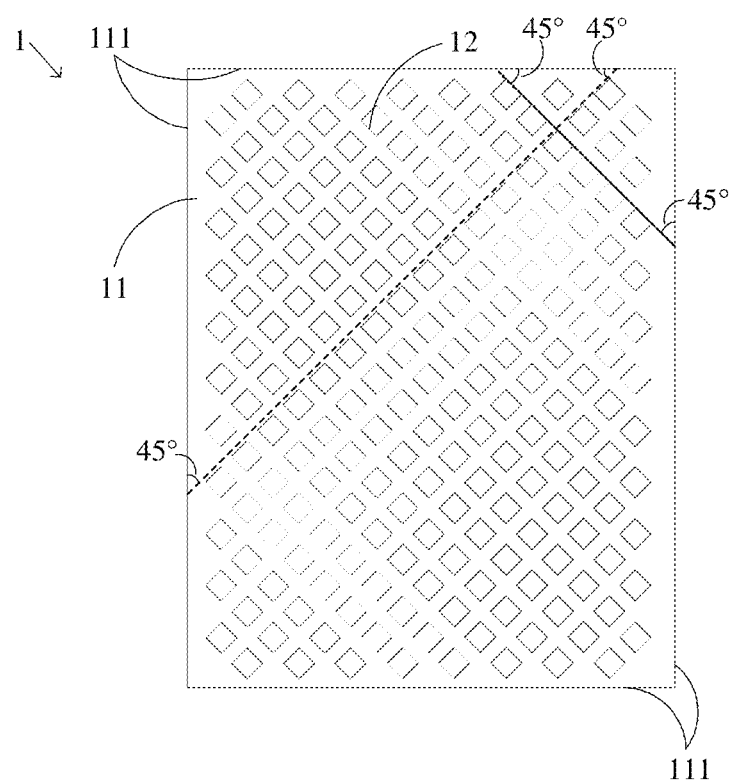
FIG. 3 is a schematic top view of a chip before soldering a tin ball in an exemplary embodiment of the present disclosure.

In some embodiments, at least one side of the quadrangular pad is at a preset angle with respect to the chip substrate side 111, and the preset angle may be greater than or equal to 30° and less than or equal to 60°. As shown in FIG. 3, the polygonal pad is a square pad, a side of the square pad can be at 45° with respect to the side 111 of the chip substrate, and the square pads may be arrayed along a direction at 45° with respect to the side 111 of the chip substrate 11. The square pad in the array has a simple structure, and when the four sides of the square pads are respectively inclined at 45° with respect to the chip substrate sides 111, not only endurance to the normal stress on the outside of the chip 1 can be obtained, but also endurance to the stress at a certain angle with respect to the above normal stress can be obtained, which can improve the overall ability of the pad 12 to resist stress. In addition, the square pads may be arrayed along a direction at 45° with respect to the side 111 of the chip substrate 11, such that the corresponding sides of the square pads arrayed along a certain direction are in a straight line, and the sides on the same straight line have a same stress resistance direction, thereby enhancing the ability of the pad 12 to resist stress.

In some embodiments, the above quadrangular pad may be a square pad, and the side length of the square pad may be 0.18 mm, or any value between 0.16 mm and 0.2 mm, which is not limited in the present disclosure. A distance between adjacent sides of adjacent square pads can be maintained to be 0.12 mm to avoid structural interference and risk of short circuits between adjacent pads. In processing the pad 12, the pad 12 can be processed through steel mesh and SMT printing technology. In the existing process, the steel mesh can be made of FG and nanocomposite materials, the thickness of the steel mesh is 0.08 mm, and solder paste powder 5 # can be used to print to form the pad 12. A width-thickness ratio of opening of the steel mesh may be greater than 1.5, and an area ratio may be greater than 0.54. The width-thickness ratio is the ratio of the narrowest width of the opening to the thickness of the steel mesh, and the narrowest width of the opening of the steel mesh is not less than 0.12 mm. The area ratio is the ratio of sidewall area of the opening of the steel mesh to bottom area of the opening of the steel mesh. After verification, the square pads with a side length of 0.18 mm obtained by the above method can meet production requirements in terms of drop tin molding, such as, height, area and volume of the drop tin.

Weight of the chip 1 borne by of the tin ball 13 per unit area can be calculated in two chips 1 with the same size and different arrangements of the pads 12. For example, with respect to the chips 1 with the same size of 10 mm*10 mm, a distance between centers of two adjacent pads 12 on a first type of chip 1 is 0.3 mm (i.e., a pitch of 0.3 mm); a distance between centers of two adjacent pads 12 on a second type of chip 1 is 0.35 mm (i.e., a pitch of 0.35 mm). The influence of thermal stress deformation on the forming of tin ball 13 mainly depends on the weight of the chip 1 borne by the tin ball 13 per unit area and the packaging material of chip 1. According to the table below, the weight of chip 1 borne by the tin ball 13 on the first type of chip 1 is lighter than the weight of chip 1 borne by the tin ball 13 on the second type of chip 1.

| Chip packaging | Chip size | Chip weight | Solder area | Tin ball ranks | Number of tin balls | Total soldering area | Weight borne by per unit soldering area |
|---|---|---|---|---|---|---|---|
| Pitch of 0.3 mm | 10 | 100 | 0.0324 | 33 | 1089 | 35.284 | 2.834 |
| Pitch of 0.35 mm | 10 | 100 | 0.0346 | 29 | 841 | 29.114 | 3.435 |

In some embodiments, an amount of solder at corners of the square pad may not be sufficient to support electromigrated silver atoms, and a layer of flux is wrapped on the outside of the pad 12 after welding, which can effectively avoid electromigration and thus avoid a risk of short circuit due to the electromigration. The above flux may be the FLUS material in solder paste.

Figure 4:
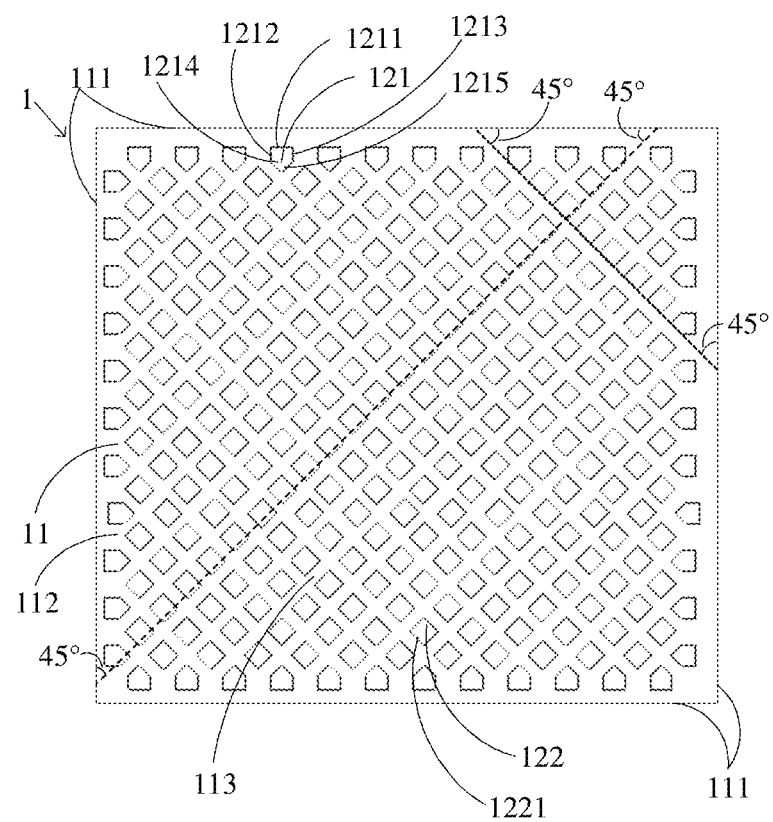
FIG. 4 is a schematic top view of a chip before soldering tin balls in an exemplary embodiment of the present disclosure.

In an embodiment, as shown in FIG. 4, the polygonal pad includes a first pad 121 and a second pad 122, and the number of straight sides of the first pad 121 is greater than the number of straight sides of the second pad 122. The chip substrate 11 includes a central area 113 and an edge area 112. The first pad 121 is provided in the edge area 112, and the second pad 122 is provided in the central area 113. Using different types of polygons to resist the stress in different regions of the chip substrate 11 helps to improve overall strength of the pad 12. When the chip 1 is impacted, since the stress on the edge area 112 of the chip substrate 11 comes from the side 111 of the chip substrate, the stress from the side 111 of the chip substrate is more complex than the stress acting on the central area 113 of the chip substrate 11, so the first pad 121 having more numbers of straight sides than the second pad 122 can help to strengthen the stress resistance effect of the edge area 112.

In the above embodiment, the edge area 112 may be provided adjacent to the side 111 of the chip substrate, and the edge area 112 may surround the central area 113.

The first pad 121 may be a pentagonal pad, and the second pad 122 may be a quadrilateral pad. The pentagonal pad includes at least one first side 1211 adjacent to and parallel to the side 111 of the chip substrate, and the quadrilateral pad includes at least one second side 1221 that is at a preset angle with respect to the side 111 of the chip substrate, the preset angle may be greater than or equal to 30° and less than or equal to 60°. In an embodiment, the preset angle may be 45°, to improve the stress buffer effect of the pad 12 in the central area 113 based on the preset angle of the quadrangular pad.

For example, as shown in FIG. 4, the first side 1211 of the pentagonal pad is parallel to the side 111, which is adjacent to the first side 1211, of the chip substrate 11; a second side 1212 and a third side 1213 of the pentagonal pad are perpendicular to the side 111 of the chip substrate 11; and a fourth side 1214 and a fifth side 1215 of the pentagonal pad are at 45° with respect to the side 111 of the chip substrate respectively. The quadrilateral pad is a square pad, and each side of the square pad is at 45° with respect to the side 111 of the chip substrate. In this way, the stress acting on the center area 113 and the edge area 112 of the chip substrate 11 can be resisted based on each side of the pentagonal pad and each side of the square pad.

For example, as shown in FIG. 4, the first pads 121 may be arrayed along a direction parallel to the side 111 of the chip substrate to be arranged in the edge area 112 of the chip substrate 11. The second pads 122 may be arrayed along a direction at a preset angle with respect to the side 111 of the chip substrate, so that the second pads 122 can be arranged in the central area 113 of the chip substrate 11. The preset angle may be greater than or equal to 30° and less than or equal to 60°. In some embodiments, the preset angle may be 45°, to form a better buffer effect for stress in various directions based on the direction along which the second pads 122 are arrayed. The first pads 121 and the second pads 122 may also be arrayed along other directions, which is not limited in the present disclosure. The first pads 121 may surround the chip substrate 11 for one, two or more circles to obtain an array with one row, two rows or more rows for each side of the chip substrate.

In some embodiments, the above quadrangular pads may have any suitable shape, such as square pads, diamond pads or other quadrangular pads, which is not limit in the present disclosure. Further, the area of the first pad 121 and the second pad 122 may be the same to have substantially same area of soldering on the tin balls 13 and avoid causing interference and influence on the soldering process when improving the structure and shape of the first pad 121 and/or the second pad 122. In some embodiments, the first pad 121 may be one or more of other polygonal pads, such as a triangular pad, a quadrangular pad, and a hexagonal pad; and the second pad 122 may be one or more of other polygonal pads, a triangular pad, a pentagonal pad, and a hexagonal pad, which is not limited in the present disclosure.

Figure 5:
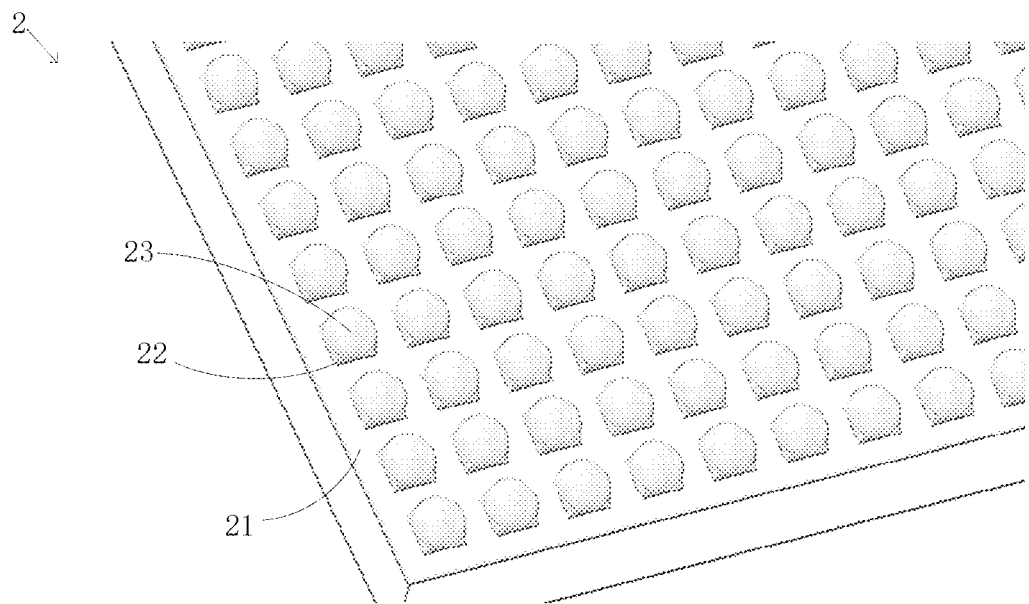
FIG. 5 is a partial three-dimensional schematic diagram of a circuit board after soldering tin balls in an exemplary embodiment of the present disclosure.
Figure 6:
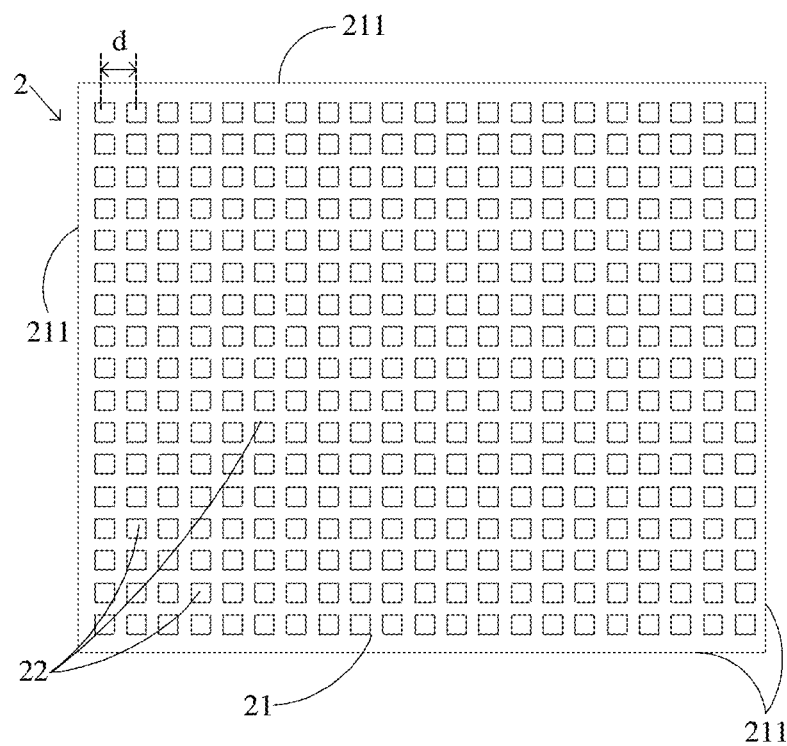
FIG. 6 is a schematic top view of a circuit board before soldering tin balls in an exemplary embodiment of the present disclosure.

FIG. 5 is a partial three-dimensional schematic diagram of a circuit board 2 after soldering tin balls in an exemplary embodiment of the present disclosure; and FIG. 6 is a schematic top view of the circuit board 2 before soldering tin balls in an exemplary embodiment of the present disclosure. As shown in FIGS. 5 and 6, the circuit board 2 includes a circuit board substrate 21 and a plurality of pads 22 provided on the circuit board substrate 21. The plurality of pads 22 are arrayed on the circuit board substrate 21, and the pad 22 may be a polygonal pad.

In some embodiments, the pad 12 on the circuit board 2 is provided as a polygonal pad, and the change in the shape of the pad 12 can shorten a distance between adjacent pads 22, and thus the circuit board 2 can have a reduced size. In addition, an array of the polygonal pads which has a straight side may improve ability of the pad 22 to resist stress, increase structural strength of the pad 22 itself. A tin ball 23 can be soldered on each pad. The above structure can further increase bonding strength between the pad 22 and the tin ball 23, prevent the pad 22 and the tin ball 23 from being disconnected from each other due to impacts, drops and the like during testing and using, and improve the circuit board 2 to be slimmer.

In some embodiments, based on the above configuration, a distance d between centers of adjacent pads 22 can be 0.3 mm. The pad 22 on the circuit board 2 is a polygonal pad. By changing the shape of the pad 22, the distance d between adjacent pads 12 is shortened to 0.3 mm, thereby reducing the size of the circuit board 2. When the pad 22 is a polygonal pad, the side of the polygonal pad is a straight side, and the straight side has a good stress buffer effect. With sufficient stress resistance strength of the pad 22 being ensured and no short circuit problem such as stringing tin between adjacent pads 22, the polygonal pad can have a reduced area compared to a circular pad, while the distance between the sides of adjacent pads 22 remains unchanged, for example, the distance between the sides of adjacent pads 22 is 0.12 mm, and the overall size of the circuit board 2 using polygonal pads can be reduced.

In some embodiments, the plurality of pads 22 may include at least one polygonal pad and at least one pad with another shape. In some embodiments, the plurality of pads 22 are all polygonal pads. The pad 22 on the circuit board 2 bears normal stress due to deformation when the circuit board 2 is for example, impacted, and if the pad 22 is designed to have the polygonal structure, a portion of the pad 22 that bears the external force is a side of the polygonal pad (not an arc vertex as usual), and a ratio of a part of sides of the polygonal pad for bearing the external force to the total side length can be increased to 60% from 33%. According to the Griffith fracture criterion: a necessary condition for generating a brittle fracture under a static condition is that energy released by a fracture zone is equal to energy required to form a crack area. That is, if the energy generated by the external stress is to produce a crack, the energy due to the external stress must be greater than the energy required to form the crack area. When the crack area is approximated as a rectangle for calculation, it is found that when the crack depth is the same, the longer the crack, the larger the crack area; the wider the width of the crack surface, the shorter the crack length, and the smaller the crack area when the crack depth is the same. That is, the increase in the width of the surface where cracks may occur can effectively decompose the stress acting on the surface. Under the same applied deformation force, the wider the width of the solder joint on the outer surface of the circuit board 2, the shorter the crack depth will be, which makes the pad 22 of the circuit board 2 with a wider outside has a stronger ability to withstand the normal stress on the outside of the circuit board 2, and thus the straight side of the polygonal pad array can facilitate to strengthen the ability of the pad 22 to resist stress.

In the above embodiment, the polygonal pad may include at least one of a quadrangular pad, a pentagonal pad, a hexagonal pad, or an octagonal pad. In some embodiments, at least part of the pads 22 may be arrayed along a direction parallel to a side 211 of the circuit board substrate, and/or at least part of the pads 22 may be arrayed along a direction at a preset angle with respect to the side 211 of the circuit board substrate, and the preset angle can be greater than or equal to 30° and less than or equal to 60°. In an embodiment, the preset angle may be 45°, to achieve a better buffer effect for stress in various directions based on the direction along which the pads 22 are arrayed.

In some embodiments, the polygonal pad may be a quadrilateral pad. For example, as shown in FIG. 6, the polygonal pad is a square pad. The sides of the square pad are parallel or perpendicular to the side 211 of the circuit board substrate, and the square pads may be arrayed along a direction parallel to the side 211 of the circuit board substrate. The square pad in the array has a simple structure, and an enhanced ability to withstand the normal stress on the outside of the circuit board 2 due to the square pad has four sides parallel or perpendicular to the side 211 of the circuit board substrate.

Figure 7:
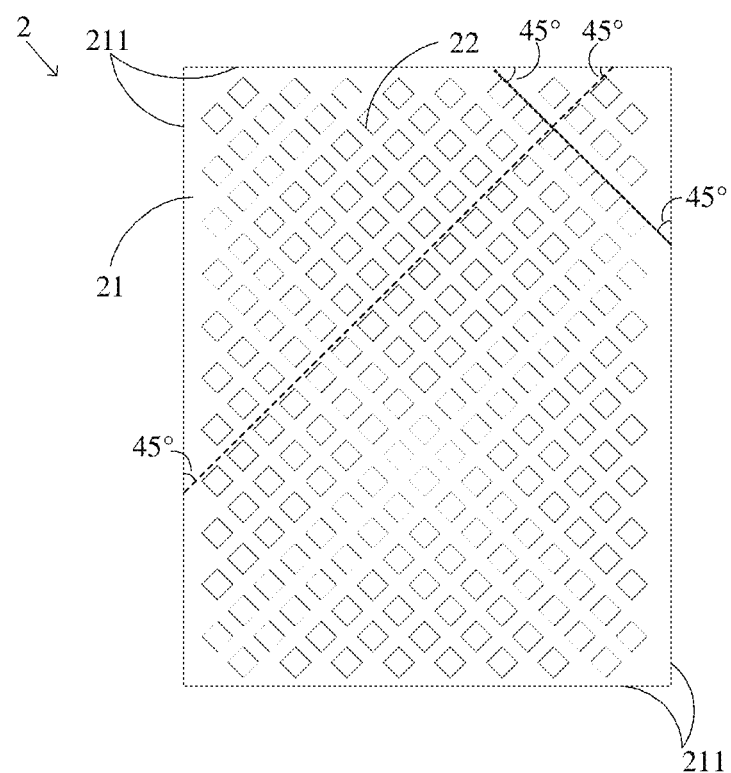
FIG. 7 is another schematic top view of a circuit board before soldering tin balls in an exemplary embodiment of the present disclosure.

In some embodiments, at least one side of the quadrangular pad is at a preset angle with respect to the circuit board substrate side 211, and the preset angle may be greater than or equal to 30° and less than or equal to 60°. As shown in FIG. 7, the polygonal pad is a square pad, a side of the square pad can be at 45° with respect to the side 211 of the circuit board substrate, and the square pads may be arrayed along a direction at 45° with respect to the side 211 of the circuit board substrate. The square pad in the array has a simple structure, and when the four sides of the square pads are respectively inclined at 45° with respect to the circuit board substrate sides 211, not only endurance to the normal stress on the outside of the circuit board 2 can be obtained, but also endurance to the stress at a certain angle with respect to the above normal stress can be obtained, which can improve the overall ability of the pad 22 to resist stress. In addition, the square pads may be arrayed along a direction at 45° with respect to the side 211 of the circuit board substrate, such that the corresponding sides of the square pads arrayed along the direction are in a straight line, and the sides on the same straight line have a same stress resistance direction, thereby enhancing the ability of the pad 22 to resist stress.

In some embodiments, the above quadrangular pad may be a square pad, and when the side length of the square pad on the chip 1 is 0.18 mm, the side length of the square pad on the circuit board 2 may be 0.2 mm. A distance between adjacent sides of adjacent square pads on the circuit board 2 can be maintained to be 0.12 mm to avoid structural interference and risk of short circuits between adjacent pads. When the side length of the square pad 12 on the chip 1 changes within the range of 0.16 mm-0.2 mm, the size of the square pad on the circuit board 2 can be adjusted within the range of 0.16 mm-0.22 mm. The size of the pad on the circuit board 2 can be equal to or slightly larger than the size of the pad on the chip 1 to facilitate the soldering process. In processing the pad 22, the pad 22 can be processed through steel mesh and SMT printing technology. In the existing process, the steel mesh can be made of FG and nanocomposite materials, the thickness of the steel mesh is 0.08 mm, and solder paste powder 5 # can be used to print to form the pad 22. A width-thickness ratio of opening of the steel mesh should be greater than 1.5, and an area ratio should be greater than 0.54. The width-thickness ratio is the ratio of the narrowest width of the opening to the thickness of the steel mesh, and the narrowest width of the opening of the steel mesh is not less than 0.12 mm. The area ratio is the ratio of sidewall area of the opening of the steel mesh to bottom area of the opening of the steel mesh. After verification, the square pads with a side length of 0.2 mm obtained by the above method can meet production requirements in terms of drop tin molding, such as, height, area and volume of the drop tin.

In some embodiments, an amount of solder at corners of the square pad may not be sufficient to support electromigrated silver atoms, and a layer of flux is wrapped on the outside of the pad 22 after welding, which can effectively avoid electromigration and thus avoid a risk of short circuit due to the electromigration. The above flux is the FLUS material in solder paste.

In some embodiments, when the chip is not soldered to the circuit board 2, the size of the square pad on the chip can be 0.18 mm*0.18 mm, with a diagonal tolerance of ±7%; on the square pad of the chip, the diameter of the tin ball 23 of a singulated pad 22 may be 0.215 mm (±5%), the height of the tin ball 23 of the singulated pad 22 may be 0.15 mm (±5%), and the volume of the tin ball 23 of the singulated pad 22 may be 0.0041 $mm^3$ (±10%). After the chip is soldered to the circuit board 2, the size of the square pad on the chip can be 0.18 mm*0.18 mm, with a diagonal tolerance of ±7%; the diameter of the tin ball 23 in the middle widest area may be 0.225 mm (±10%), the size of the pad 22 of the circuit board 2 may be 0.20 mm*0.20 mm (±10%), the copper size of the pad of the circuit board may be 0.26 mm*0.26 mm (±5%), tin ball 23 height may be 0.14 mm (+10%, −15%), and the volume of tin ball 23 may be 0.0052 mm$^3$ (±10%).

Figure 8:
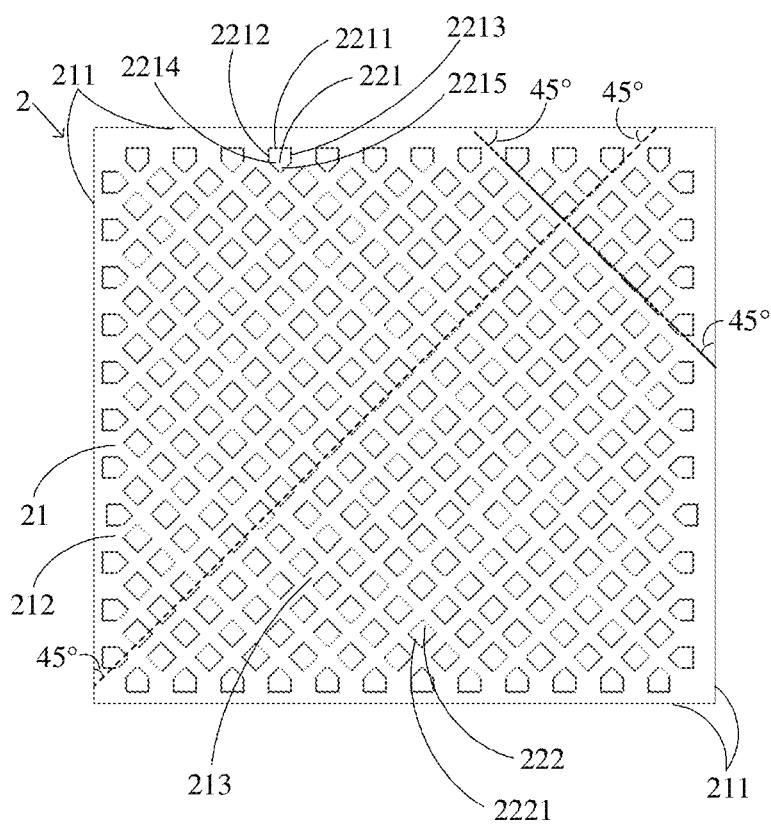
FIG. 8 is a schematic top view of a circuit board before soldering tin balls in an exemplary embodiment of the present disclosure.

In an embodiment, as shown in FIG. 8, the polygonal pad includes a first pad 221 and a second pad 222, and the number of straight sides of the first pad 221 is greater than the number of straight sides of the second pad 222. The circuit board substrate 21 includes a central area 223 and an edge area 212. The first pad 221 is provided in the edge area 212, and the second pad 222 is provided in the central area 223. Using different types of polygons to resist the stress in different regions of the circuit board substrate 21 helps to improve overall strength of the pad 12. When the circuit board 2 is impacted, since the stress on the edge area 212 of the circuit board substrate 21 comes from the side 211 of the circuit board substrate, the stress from the side 211 of the circuit board substrate is more complex than the stress acting on the central area 223 of the circuit board substrate 21, so the first pad 221 having more numbers of straight sides than the second pad 222 can help to strengthen the stress resistance effect of the edge area 212.

In the above embodiment, the edge area 212 may be provided adjacent to the side 211 of the circuit board substrate, and the edge area 212 may surround the central area 223.

The first pad 221 may be a pentagonal pad, and the second pad 222 may be a quadrilateral pad. The pentagonal pad includes at least one first side 2211 adjacent to and parallel to the side 211 of the circuit board substrate, and the quadrilateral pad includes at least one second side 2221 that is at a preset angle with respect to the side 211 of the circuit board substrate, the preset angle may be greater than or equal to 30° and less than or equal to 60°. In an embodiment, the preset angle may be 45°, to improve the stress buffer effect of the pad 22 in the central area 223 based on the preset angle of the quadrangular pad.

For example, as shown in FIG. 8, the first side 2211 of the pentagonal pad is parallel to the side 211, which is adjacent to the first side 2211, of the circuit board substrate; a second side 2212 and a third side 2223 of the pentagonal pad are perpendicular to the side 211 of the circuit board substrate; and a fourth side 2214 and a fifth side 2215 of the pentagonal pad are at 45° with respect to the side 211 of the circuit board substrate respectively. The quadrilateral pad is a square pad, and each side of the square pad is at 45° with respect to the side 211 of the circuit board substrate. In this way, the stress acting on the center area 223 and the edge area 212 of the circuit board substrate 21 can be resisted based on each side of the pentagonal pad and each side of the square pad.

For example, as shown in FIG. 8, the first pads 221 may be arrayed along a direction parallel to the side 211 of the circuit board substrate to be arranged in the edge area 212 of the circuit board substrate 21. The second pads 222 may be arrayed along a direction at a preset angle with respect to the side 211 of the circuit board substrate, so that the second pads 222 can be arranged in the central area 223 of the circuit board substrate 21. The preset angle may be greater than or equal to 30° and less than or equal to 60°. In some embodiments, the preset angle may be 45°, to form a better buffer effect for stress in various directions based on the direction along which the second pads 222 are arrayed. In some embodiments, the first pads 221 and the second pads 222 may be arrayed along other directions, which is not limited in the present disclosure. The first pads 221 may surround the circuit board substrate 21 for one, two or more circles to obtain an array with one row, two rows or more rows for each side of the circuit board substrate.

In some embodiments, the above quadrangular pads may have any suitable shape, such as square pads, diamond pads or other quadrangular pads, which is not limit in the present disclosure. Further, the area of the first pad 221 and the second pad 222 may be the same to have substantially same area of soldering on the tin balls 23 and avoid causing interference and influence on the soldering process when improving the structure and shape of the first pad 221 and/or the second pad 222. In some embodiments, the first pad 221 may be one or more of other polygonal pads, such as a triangular pad, a quadrangular pad, and a hexagonal pad; and the second pad 222 may be one or more of other polygonal pads, a triangular pad, a pentagonal pad, and a hexagonal pad, which is not limited in the present disclosure.

Figure 9:
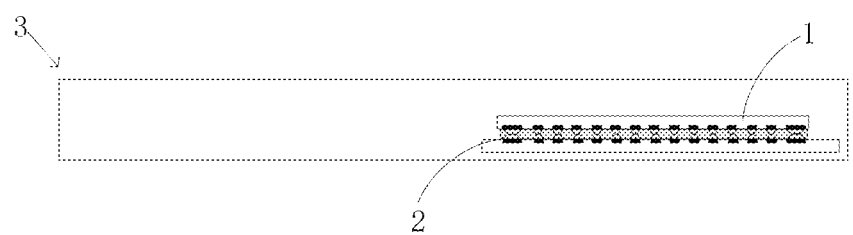
FIG. 9 is a schematic diagram of a cross-sectional view of an electronic device in an exemplary embodiment of the present disclosure.

FIG. 9 is a schematic diagram of a cross-sectional view of an electronic device 3 in an exemplary embodiment of the present disclosure. As shown in FIG. 9, the electronic device 3 includes: the chip 1 and the circuit board 2 described above. A polygonal pad of the chip 1 can be electrically connected to a polygonal pad of the circuit board 2 by tin ball soldering in one-to-one correspondence. When the polygonal pad of the chip 1 includes the first pad 121 and the second pad 122, and the polygonal pad of the circuit board 2 includes the first pad 221 and the second pad 222, the first pad 121 of the chip 1 can be electrically connected to the first pad 221 of the circuit board 2 by tin ball soldering, and the second pad 122 of the chip 1 can be electrically connected to the second pad 222 of the circuit board 2 by tin ball soldering.

In some embodiments, the pads on the chip 1 or the circuit board 2 are provided to be polygonal pads, and the distance d between adjacent pads is shortened to 0.3 mm by changing the shape of the pads, thereby reducing the size of the chip 1 and the circuit board 2. In addition, the straight side of the polygonal pad array can facilitate to strengthen the ability of the pad 22 to resist stress, increase the structural strength of the pad itself and the soldering strength between the pad and the tin ball, and prevent the pad and the tin ball from being disconnected from each other due to impacts, drops and the like during testing and using, improve the reliability of the structure, reduce the cost of fixing the chip 1 and the circuit board 2 through glue, and reduce the overall cost of the chip 1, the circuit board 2 and the electronic device 3, and improve the chip 1, the circuit board 2 and the electronic device 3 to be slimmer.

The above electronic device 3 may be a mobile phone, a tablet computer, a vehicle-mounted terminal or a medical terminal, etc., which is not limited in the present disclosure.

Those skilled in the art will easily think of other embodiments of the present disclosure after considering the specification and practicing the technical solutions disclosed herein. The present disclosure is intended to cover any variations, uses, or adaptive changes of the present disclosure. These variations, uses, or adaptive changes follow the general principles of the present disclosure and include common knowledge or conventional technical means in the technical field not disclosed in the present disclosure. The description and the embodiments are only regarded as exemplary, and the true scope and spirit of the present disclosure are indicated by the following claims.

It should be understood that the present disclosure is not limited to the precise structure that has been described above and shown in the drawings, and various modifications and changes can be made without departing from the scope thereof. The scope of the present disclosure is only limited by the appended claims.

What is claimed is:

1. A chip, comprising:
   a chip substrate; and
   a plurality of pads provided on the chip substrate,
   wherein the plurality of pads are arrayed on the chip substrate; at least one of the plurality of pads is a polygonal pad;
   the polygonal pad comprises a first pad and a second pad;
   the chip substrate comprises a central area in which the second pad is provided and an edge area in which the first pad is provided;
   the edge area is provided adjacent to a side of the chip substrate, and surrounds the central area;
   the first pad is a pentagonal pad comprising at least one first side adjacent to and parallel to the side of the chip substrate;
   the second pad is a quadrangular pad having each vertex provided with a chamfer and comprising at least one second side that is at a first preset angle with respect to the side of the chip substrate, the first preset angle being greater than or equal to 30° and less than or equal to 60°;
   and
   a layer of flux is wrapped on an outer side of each of the pentagonal pad and the quadrangular pad.

2. The chip of claim 1, wherein:
   the first preset angle is 45°, or
   the quadrangular pad is a square pad with a side length of 0.18 mm.

3. The chip of claim 1, wherein:
   at least part of the plurality of pads are arrayed along a first direction parallel to a side of the chip substrate, or along a second direction at a second preset angle with respect to the side of the chip substrate, the second preset angle being greater than or equal to 30° and less than or equal to 60°.

4. The chip of claim 1, wherein the first pad is arrayed along a direction parallel to a side of the chip substrate, and the second pad is arrayed along a direction at a third preset angle with respect to the side of the chip substrate, the third preset angle being greater than or equal to 30° and less than or equal to 60°.

5. The chip of claim 1, wherein the first pad and the second pad have same area.

6. The chip of claim 1, wherein a distance between centers of adjacent ones of the plurality of pads is 0.3 mm.

7. A circuit board, comprising:
   a circuit board substrate; and
   a plurality of pads provided on the circuit board substrate,
   wherein the plurality of pads are arrayed on the circuit board substrate;
   at least one of the plurality of pads is a polygonal pad;
   the polygonal pad comprises a first pad and a second pad;
   the circuit board substrate comprises a central area in which the second pad is provided and an edge area in which the first pad is provided;
   the edge area is provided adjacent to a side of the circuit board substrate, and surrounds the central area;
   the first pad is a pentagonal pad comprising at least one first side adjacent to and parallel to the side of the circuit board substrate;
   the second pad is a quadrangular pad having each vertex provided with a chamfer and comprising at least one second side that is at a first preset angle with respect to the side of the circuit board substrate, the first preset angle being greater than or equal to 30° and less than or equal to 60°;
   and
   a layer of flux is wrapped on an outer side of each of the pentagonal pad and the quadrangular pad.

8. The circuit board of claim 7, wherein:
   the first preset angle is 45°, or
   the quadrangular pad is a square pad with a side length of 0.2 mm.

9. The circuit board of claim 7, wherein at least part of the plurality of pads are arrayed along a first direction parallel to a side of the circuit board substrate, or along a second direction at a second preset angle with respect to the side of the circuit board substrate, the second preset angle being greater than or equal to 30° and less than or equal to 60°.

10. The circuit board of claim 7, wherein:
    the first pad is arrayed along a first direction parallel to a side of the circuit board substrate; and
    the second pad is arrayed along a second direction at a third preset angle with respect to the side of the circuit board substrate, the third preset angle being greater than or equal to 30° and less than or equal to 60°.

11. The circuit board of claim 7, wherein the first pad and the second pad have same area.

12. The circuit board of claim 7, wherein a distance between centers of adjacent ones of the plurality of pads is 0.3 mm.

13. An electronic device, comprising:
    a chip; and
    a circuit board,
    wherein the chip comprises:
      a chip substrate; and
      a first plurality of pads provided on the chip substrate, wherein
      the first plurality of pads are arrayed on the chip substrate, and at least one of the first plurality of pads is a polygonal pad;
      the polygonal pad provided on the chip substrate comprises a first pad and a second pad;
      the chip substrate comprises a central area in which the second pad is provided and an edge area in which the first pad is provided; and
      the edge area is provided adjacent to a side of the chip substrate, and surrounds the central area; and
    wherein the circuit board comprises:
      a circuit board substrate; and
      a second plurality of pads provided on the circuit board substrate,
      wherein the second plurality of pads are arrayed on the circuit board substrate, and at least one of the second plurality of pads is a polygonal pad;
      the polygonal pad provided on the circuit board substrate comprises a third pad and a fourth pad;
      the circuit board substrate comprises a central area in which the fourth pad is provided and an edge area in which the third pad is provided; and
      the edge area is provided adjacent to a side of the circuit board substrate, and surrounds the central area;
      wherein
      the first pad is a pentagonal pad comprising at least one first side adjacent to and parallel to a side of the chip substrate;

the second pad is a quadrangular pad having each vertex provided with a chamfer and comprising at least one second side that is at first a preset angle with respect to the side of the chip substrate, the first preset angle being greater than or equal to 30° and less than or equal to 60°;

the third pad is a pentagonal pad comprising at least one first side adjacent to and parallel to the side of the circuit board substrate;

the fourth pad is a quadrangular pad having each vertex provided with a chamfer and comprising at least one second side that is at a second preset angle with respect to the side of the circuit board substrate, the second preset angle being greater than or equal to 30° and less than or equal to 60°;

and a layer of flux is wrapped on an outer side of each of the pentagonal pad and the quadrangular pad.

* * * * *